United States Patent
Ma et al.

(10) Patent No.: US 9,605,359 B2
(45) Date of Patent: Mar. 28, 2017

(54) THERMAL DIFFUSION DOPING OF DIAMOND

(71) Applicant: Wisconsin Alumni Research Foundation, Madison, WI (US)

(72) Inventors: Zhenqiang Ma, Middleton, WI (US); Jung-Hun Seo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/508,187

(22) Filed: Oct. 7, 2014

(65) Prior Publication Data

US 2016/0097145 A1    Apr. 7, 2016

(51) Int. Cl.
| | |
|---|---|
| C30B 31/02 | (2006.01) |
| C30B 29/04 | (2006.01) |
| C30B 33/02 | (2006.01) |
| H01L 29/16 | (2006.01) |
| H01L 21/324 | (2006.01) |
| H01L 21/04 | (2006.01) |

(52) U.S. Cl.
CPC .............. *C30B 31/02* (2013.01); *C30B 29/04* (2013.01); *C30B 33/02* (2013.01); *H01L 21/041* (2013.01); *H01L 21/324* (2013.01); *H01L 29/1602* (2013.01)

(58) Field of Classification Search
None
See application file for complete search history.

(56) References Cited

U.S. PATENT DOCUMENTS

| | | | |
|---|---|---|---|
| 5,075,757 A | 12/1991 | Ishii et al. | |
| 5,309,000 A * | 5/1994 | Saito | .............. H01L 21/0415 148/33.4 |
| 5,382,808 A * | 1/1995 | Dreifus | .............. H01L 21/043 257/607 |

OTHER PUBLICATIONS

Tsai et al., "Diamond MESFET Using Ultrashallow RTP Boron Doping", IEEE Electron Device Letters, vol. 12, No. 4, Apr. 1991, pp. 157-159.*
Seo et al., Thermal Diffusion Doping of Single Crystal Diamond, Abstract, arXiv:1402.1883v2, Available from internet on Jun. 25, 2014.
Madani et al., Boron doping diamond by thermal diffusion, Rapport LAAS No. 12261, International Conference on Diamond and Carbon Materials, Grenade, Abstract, Sep. 3, 2012.
Popovici et al., Forced Diffusion in Diamond: A Review, Journal of Chemical Vapor Deposition, vol. 3, Oct. 1994, pp. 115-132.
Popovici et al., Diffusion of Boron, Hydrogen, Oxygen and Lithium in Single Crystalline and Polycrystalline Diamond. A Novel Method for the Determination of the State of an Impurity: Forced Diffusion of Boron in IA Type Natural Diamond, M.A. Prelas et al. (eds.), Wide Band Gap Electronic Materials, 1995, pp. 15-29.
Sung et al., Boron diffusion into diamond under electric bias, Journal of Materials Research, vol. 12, No. 5, May 1997, pp. 1169-1171.

(Continued)

*Primary Examiner* — Erik Kielin
(74) *Attorney, Agent, or Firm* — Bell & Manning, LLC (57) ABSTRACT

Boron-doped diamond and methods for making it are provided. The doped diamond is made using an ultra-thin film of heavily boron-doped silicon as a dopant carrying material in a low temperature thermal diffusion doping process.

20 Claims, 10 Drawing Sheets

(56) References Cited

OTHER PUBLICATIONS

Sung et al., Boron Diffusion Coefficient in Diamond, Materials Research Society Symposium Proceedings, vol. 416, 1996, pp. 467-470.

Krutko et al., P-type polycrystalline diamond layers by rapid thermal diffusion of boron, Applied Physics Letters, vol. 76, No. 7, Feb. 14, 2000, pp. 849-851.

* cited by examiner

THERMAL DIFFUSION DOPING OF DIAMOND

REFERENCE TO GOVERNMENT RIGHTS

This invention was made with government support under FA9550-09-1-0482 awarded by the USAF/AFOSR. The government has certain rights in the invention.

BACKGROUND

Diamond is considered a good material candidate for power electronics with the capability of providing power switching efficiency, reliability, and small system volume and low weight. However, single-crystalline diamond (SCD) is ultra-stable and chemically inert to most reactive reagents due to the strong σ-bonds formed between its adjacent carbon atoms. As a result, substitutional doping of single-crystalline diamond is very difficult.

Ion implantation has been attempted to achieve substitutional doping of SCD. However, the ion implantation process needs to be carried out at elevated temperatures to prevent bulk phase transition-graphitization. In addition, a very high post-implantation temperature anneal under a high vacuum is required to restore the damaged lattice and to activate implanted dopants. During this annealing process, and for high dose implantation in particular, surface graphitization still occurs, thereby creating additional unwanted processing complications for practical applications.

An alternative approach to ion implantation is in-situ doping during the epitaxial growth of diamond. However in-situ doping has a number of intrinsic limitations for practical use (e.g., selective doping) due to the need for high temperature and high density plasma during growth. For example, realizing uniform doping concentrations across a diamond substrate using plasma enhanced epitaxial growth is rather challenging due to high plasma concentrations near the edges of diamond substrates. The small size of diamond as a substrate worsens the non-uniformity doping problem of in-situ doping. Using in-situ doping also negatively affects film and crystal quality during plasma assisted epitaxial growth.

In a previous study, a solid boron film was deposited on polycrystalline diamond in order to allow boron doping. While a very high temperature was needed in this process and the feasibility of this method in the context of SCD doping is unknown, diodes made of polycrystalline diamond are undesirable because they show very high leakage current.

SUMMARY

Boron-doped diamond and methods for making it are provided.

One embodiment of the boron-doped diamond comprises: a layer of diamond comprising a doped region extending into the layer from a surface, the doped region comprising substitutional boron dopant atoms, wherein the concentration of substitutional boron dopant atoms at the surface is at least $2\times10^{19}$ cm$^{-3}$ and the depth profile of the substitutional boron dopant atoms corresponds to a complimentary-error-function.

One embodiment of a method of making boron-doped diamond comprises the steps of: bonding a boron-doped single-crystalline silicon nanomembrane to the surface of a layer of diamond; and annealing the diamond and the nanomembrane at a temperature of at least 700° C. for a time sufficient to allow boron dopant atoms from the nanomembrane to diffuse into the layer of diamond to form a doped region in the diamond.

The diamond may be single-crystalline or polycrystalline, including nanocrystalline, diamond.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Boron-doped diamond and methods for making it are provided. The doped diamond is made using an ultra-thin film of heavily boron-doped silicon as a dopant carrying material in a low temperature thermal diffusion doping process. The doping is carried out by bonding the doped ultra-thin silicon film, referred to herein as a silicon nanomembrane (SiNM), to a surface of a layer of diamond and annealing the diamond and its bound doped silicon nanomembrane, whereby boron dopant atoms from the silicon thermally diffuse into the surface of the diamond to create a boron-doped region.

This thermal doping method provides a simple strategy for doping diamond with electrically activated, substitutional boron atom dopants without inducing any phase transitions or lattice damage in the diamond crystal. The use of silicon nanomembranes as a dopant carrier is advantageous because, in contrast to a bulk silicon substrate that is rigid and difficult to bond to diamond, the bonding force of silicon nanomembranes to diamond is extremely strong since the bonding force increases exponentially with the reduction in thickness. The ultra-mechanical flexibility of silicon nanomembranes also allows for conformal and high fidelity bonding with a high tolerance for surface roughness when bonding to diamond. This tight, conformal bonding between the doped silicon nanomembrane and the surface of the diamond allows for effective, uniform and selective doping of diamond without inducing graphitization of the underlying diamond surface.

Figure 1:
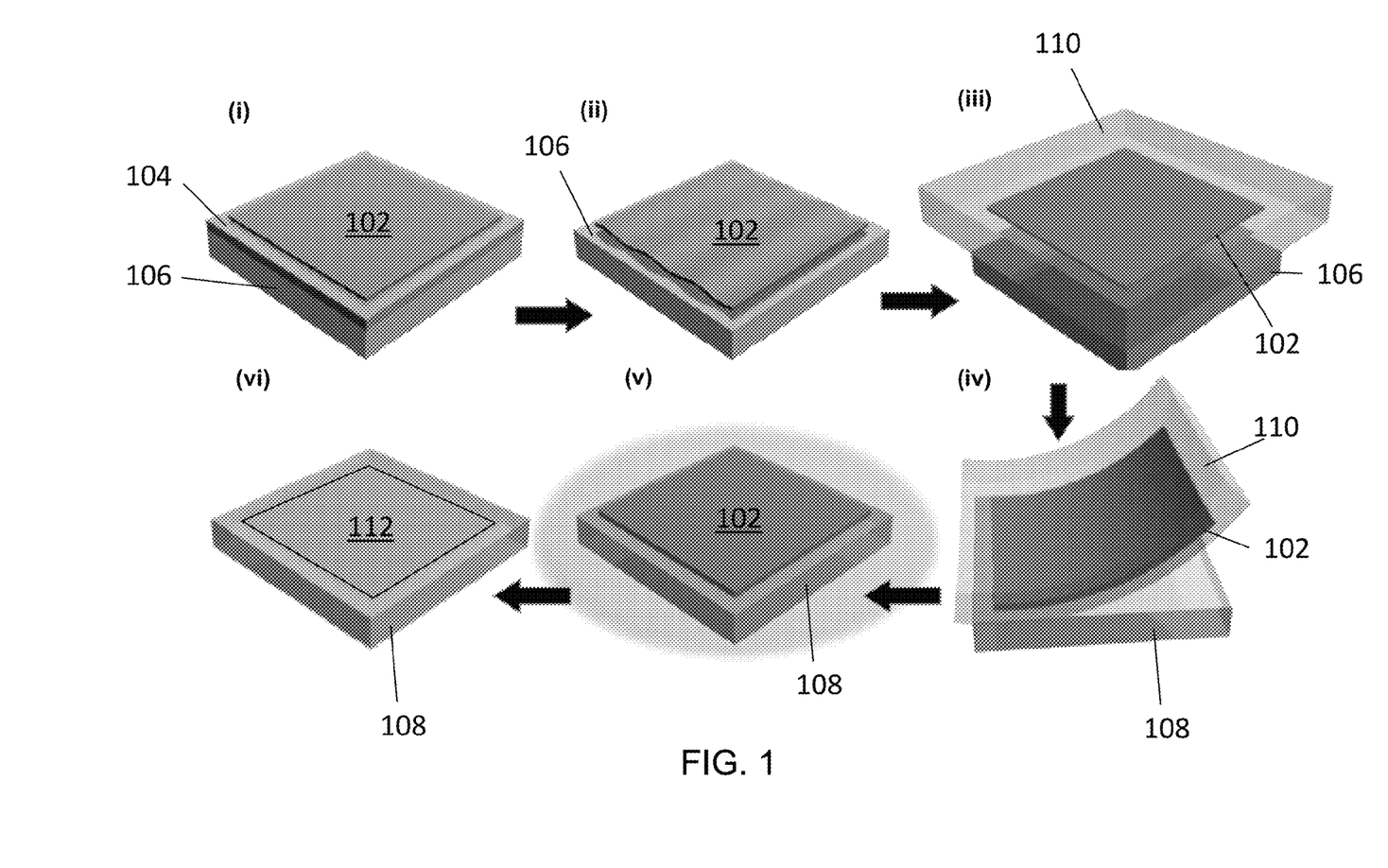
FIG. 1. Process flow for boron doping single-crystalline diamond plates. (i) Heavy boron implantation in the silicon device layer of an SOI wafer followed by thermal annealing to realize a heavily doped silicon device layer; (ii) Heavily boron-doped single-crystalline silicon device layer released as an SiNM by selective etching of the buried SiO$_2$ layer; (iii) Released, free-standing boron-doped SiNM picked up by an elastomeric stamp; (iv) SiNM transferred to a single-crystalline diamond plate; (v) Bond forming between SiNM and diamond and thermal diffusion with RTA; (vi) SiNM removal.

FIG. 1 is a schematic diagram of one embodiment of the thermal doping process flow. In brief, a heavily boron-doped single-crystalline silicon nanomembrane is first formed from a silicon-on-insulator wafer (SOI) substrate. The SOI wafer comprises a layer of single-crystalline silicon 102, atop a buried silicon oxide layer 104, atop a silicon handle layer 106 (panel i). Doped single-crystalline silicon nanomembrane 102 is then released by selectively removing (e.g., selectively etching away) buried silicon oxide layer 104 (panel ii). Released silicon nanomembrane 102 is lifted from handle substrate 106 and transferred to a diamond substrate 108 using, for example, a stamp 110 assisted transfer printing method (panels iii and iv). (See, Meitl, M. A. et al. Transfer printing by kinetic control of adhesion to an elastomeric stamp. *Nature Mater.* 5, 33-38 (2006).) Diamond substrate 108 bearing silicon nanomembrane 102 is annealed using, for example, rapid thermal annealing (RTA), to strengthen the bonding between the silicon nanomembrane and the diamond and then to induce boron dopant atom diffusion from the silicon into the diamond (panel v). Silicon nanomembrane 102 is then removed from the surface of diamond layer 108, leaving a layer of single-crystalline diamond having a doped region 112 extending into its surface (panel vi).

The result of the thermal diffusion doping process is single-crystalline diamond having a very high substitutional boron dopant atom concentration at the surface of its doped region. For example, the boron concentration at the surface of the doped region of the diamond can be $1 \times 10^{18}$ cm$^{-3}$ or higher. This includes embodiments in which the boron concentration at the surface of the doped region of the diamond is $1 \times 10^{19}$ cm$^{-3}$ or higher, further includes embodiments in which the boron concentration at the surface of the doped region of the diamond is $2 \times 10^{19}$ cm$^{-3}$ or higher and still further includes embodiments in which the boron concentration at the surface of the doped region of the diamond is $2.2 \times 10^{19}$ cm$^{-3}$ or higher.

Without intending to be bound to any particular theory of the thermal diffusion process, the inventors believe that the ability to carry out thermal diffusion doping of diamond even at low temperatures (e.g., T≤1000° C.) may be attributed to the nature of the bonding between the carbon and silicon atoms at the nanomembrane/diamond interface. The silicon at the interface has a much higher intrinsic vacancy concentration than the diamond. If the silicon is doped via ion implantation, still more constitutional vacancies should be present in the silicon. In addition, as discussed in detail in the Example, interactions between silicon and carbon atoms at the nanomembrane/diamond interface may help lower the formation energy of carbon atom vacancies in the diamond. As a result carbon atoms from the diamond would be expected to 'jump' more freely into the vacancies in the silicon nanomembrane, effectively providing an "injection" of vacancies from the silicon nanomembrane into the diamond. An additional or alternative thermal diffusion enhancing factor may be the formation of SiC at the nanomembrane/diamond interface.

The depth profile of the boron dopant atoms will correspond to a complimentary-error-function characteristic of thermal diffusion and can be fit by the equation for Fick's law of diffusion. (Methods for determining and fitting the boron dopant depth profile in doped diamond are described in the Example.) As a result, the doped regions in the diamond layers can be distinguished from doped regions formed by chemical vapor deposition (CVD) or ion implantation, which provide a step-like depth profile, and from doped regions formed by dopant diffusion under an applied electric field, which are also characterized by a step function. Another advantage of the thermal diffusion doping method over ion implantation is that the lattice structural damage characteristic of ion implantation can be avoided. Therefore, the high temperature, post-implantation recrystallization needed for ion implantation doping is not necessary.

The thermal diffusion process is able to form a very shallow doped region—one in which the boron dopant atom concentration falls offs rapidly from the surface. By way of illustration, is some embodiments, the diamond is extrinsically doped to a depth of no greater than about 200 nm. This includes embodiments in which the diamond is extrinsically doped to a depth of no greater than about 100 nm. For example, in some embodiments the boron atom concentration is less than $1 \times 10^{16}$ cm$^{-3}$ at a depth of 200 nm. This includes embodiments in which the boron atom concentration is less than $1 \times 10^{16}$ cm$^{-3}$ at a depth of 100 nm and still further includes embodiments in which the boron atom concentration is less than $1 \times 10^{16}$ cm$^{-3}$ at a depth of 50 nm.

Because the annealing temperatures used in the thermal diffusion process can be kept relatively low, the diffusion of silicon into the diamond can be substantially eliminated. Thus, the present doping methods are able to form boron-doped diamond in which the doped region is free of silicon dopant atoms below a depth of 5 nm. In addition, the low temperatures used in the annealing step, the tight conformal bonding at the nanomembrane/diamond interface, and the elimination of a high-temperature post-doping thermal treatment allow the boron doping to take place without graphitizing the diamond surface. This is advantageous because it eliminates the need to remove (e.g., etch away) the outermost layers of the doped diamond surface, which have the highest boron concentration, in order to remove unwanted silicon impurities and/or graphite.

The single-crystalline silicon nanomembranes are thin films of single-crystalline silicon that have a thickness of no greater than 1 μm. In some embodiments the silicon nanomembranes have a thickness of no greater than 1000 nm, no greater than 500 nm or no greater than 100 nm. The silicon nanomembranes are free-standing in that they are not fixed to a rigid substrate, this allows them to form a conformal bond to the surface of the diamond. However, it is possible for the silicon nanomembranes to be adhered to a thin, flexible coating, such as a metal foil or polymer film, provided the coating does not interfere with the bonding of the nanomembranes to the diamond or the thermal diffusion of boron from the nanomembrane into the diamond.

The extreme thinness of the nanomembranes makes them well-suited for carrying boron dopant atoms. Like bulk crystalline silicon, the silicon nanomembranes can be heavily doped via ion implantation and post-implant thermal annealing without destroying their single crystal structure. Unlike bulk silicon, silicon nanomembranes can be easily heavily doped across their full thickness. Methods for doping silicon nanomembranes are described in Zhou, H. et al., Fast flexible electronics with strained silicon nanomembranes. *Scientific Reports* 3, 1291 (2013). SOI wafers comprising heavily boron-doped single-crystalline silicon device layer are commercially available. The boron concentration may be uniform through the thickness of the silicon nanomembrane. However, it is also possible that the boron dopant concentration will be higher near one surface. The silicon nanomembrane should be heavily doped in order to obtain a high dopant level in the diamond. Thus, in some embodiments the surface of the single-crystalline silicon nanomembrane that contacts the diamond during the thermal diffusion process has a boron concentration of at least $1 \times 10^{19}$ cm$^{-3}$. This includes embodiments in which the surface of the single-crystalline silicon nanomembrane that contacts the diamond during the thermal diffusion process has a boron concentration of at least $1 \times 10^{20}$ cm$^{-3}$, further includes embodiments in which the surface of the single-crystalline silicon nanomembrane that contacts the diamond during the thermal diffusion process has a boron concentration of at least $5 \times 10^{20}$ cm$^{-3}$ and still further includes embodiments in which the surface of the single-crystalline silicon nanomembrane that contacts the diamond during the thermal diffusion process has a boron concentration of at least $1 \times 10^{21}$ cm$^{-3}$.

Both natural and synthetic diamond can be substitutionally boron-doped using the present processes. The diamond may be single-crystalline or polycrystalline. Specific examples of the types of diamond materials that can be doped include type Ia and type IIa diamond.

EXAMPLE

This example clearly demonstrates the viability of boron doping through the thermal diffusion process using heavily doped, bonded SiNM as dopant carrying medium.

Methods.

Device Fabrication

Commercially available type-IIa nSCD (from Harris International) plates were used in this study. The different pieces of nSCDs were characterized as having the same properties. For SiNM bonding to diamond, the fabrication began with an SOI wafer (from Soitec) with a boron-doped 200 nm top single-crystalline Si layer and a doping level of $4 \times 10^{15}$ cm$^{-3}$. A 30 nm of thermally grown SiO$_2$ on an SOI wafer was used as a screen oxide layer prior to ion implantation. Ion implantation was carried out with boron ions at an energy level of 16 KeV and a dose of $3 \times 10^{15}$ atoms/cm$^2$ at a 7 degree incident angle. Furnace annealing then took place at 950° C. for 90 min under nitrogen ambient. During annealing, Si recrystallization and dopant redistribution occurred. After dopant redistribution, the boron concentration at the bottom side of the top single-crystalline Si layer reached ~$10^{20}$ cm$^{-3}$. After photolithography and reactive ion etching (RIE, Unaxis 790) steps for defining the etching holes on the top Si layer were completed, the 145 nm buried oxide layer of the SOI wafer was undercut with concentrated hydrofluoric acid (HF, 49%). The released top single-crystalline Si layer, now a boron-doped SiNM, was transfer printed onto an nSCD plate. Detailed transfer printing procedures can be found elsewhere. (See, Aharonovich, I., Greentree, A. D. & Prawer, S. Diamond photonics. *Nature Photon.* 5, 397-405 (2011) and Zhou, H. et al. Fast flexible electronics with strained silicon nanomembranes. *Scientific Reports* 3, 1291 (2013).) Prior to the transfer printing step, the nSCD plate was immersed in an ammonium sulphuric acid solution for 30 min at 200° C. and then rinsed in an ammonium hydroxide/hydrogen peroxide solution, followed by a deionized (DI) water rinse to obtain a contaminant-free and native oxide-free surface. The nSCD plates with the transferred boron-doped SiNM on top were annealed in an RTA for 40 min at 800° C. under nitrogen ambient.

With regard to diode fabrication, the cathode electrode was formed on the bottom side of the nSCD plate, with Ti/Pt/Au (20/50/100 nm) by e-beam evaporation, followed by annealing at 450° C. with RTA. Next, the anode metal of Ti/Au (20 nm/150 nm) was formed on top of the SiNM. For diodes without a Si layer, the top Si layer was removed using dry etching before forming the top metal contacts (Ti/Pt/Au: 20/50/100 nm). The metal pad size formed on both diamond and SiNM was 20 µm×40 µm with 35 µm distance in between the metal pads. Using the anode metal pads on the SiNM as an etching mask, the SiNM around the metal pads was dry etched away until the diamond surface was exposed. Further etching by reactive ion etching (RIE) with oxygen was carried out to etch the diamond surface 50 nm down from the initial diamond surface to minimize the current flow on the diamond surface. I-V and C-V characteristics were obtained using an Agilent 4155B semiconductor parameter analyzer, Keithley 237 high-voltage source-measure unit and an Agilent E4980A precision LCR meter in the dark to avoid any light induced photocurrents.

Characterization

The diamond crystal structures, before and after boron diffusion doping, were first characterized and then compared. Before performing the characterizations, the SiNM was completely removed using potassium hydroxide (KOH) after completion of the RTA process. No graphitization removal procedures were applied to the diamond surface.

X-ray diffraction (XRD) was performed using a PANalytical X'Pert PRO diffractometer with Cu Kα radiation. Raman analysis was carried out using a Horiba LabRAM ARAMIS Raman confocal microscope with 18.5 mW of He—Ne (632.8 nm) laser light. The spectrometer resolution was 0.045 cm$^{-1}$. A Secondary Ion Mass Spectrometry (SIMS) profile was obtained from QSPEC Technology, Inc. FTIR spectra were acquired using a NICOLET iN-10 FT-IR (Thermo Scientific) with a spectral resolution of 2 cm$^{-1}$ in the scanning range from 500 cm$^{-1}$ to 3,500 cm$^{-1}$.

Figure 2:
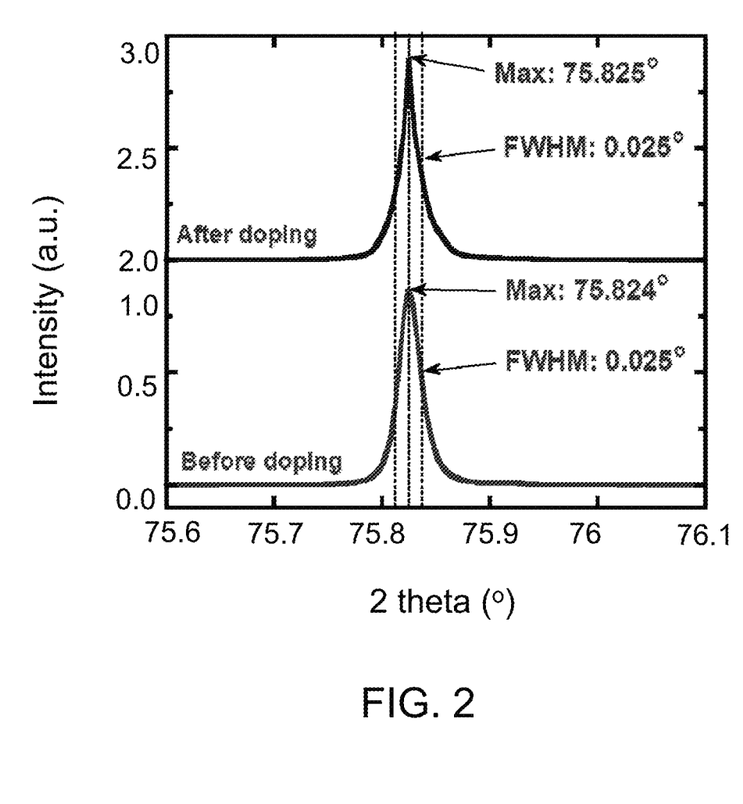
FIG. 2. XRD spectra of the single-crystalline diamond before and after boron doping.
Figure 3:
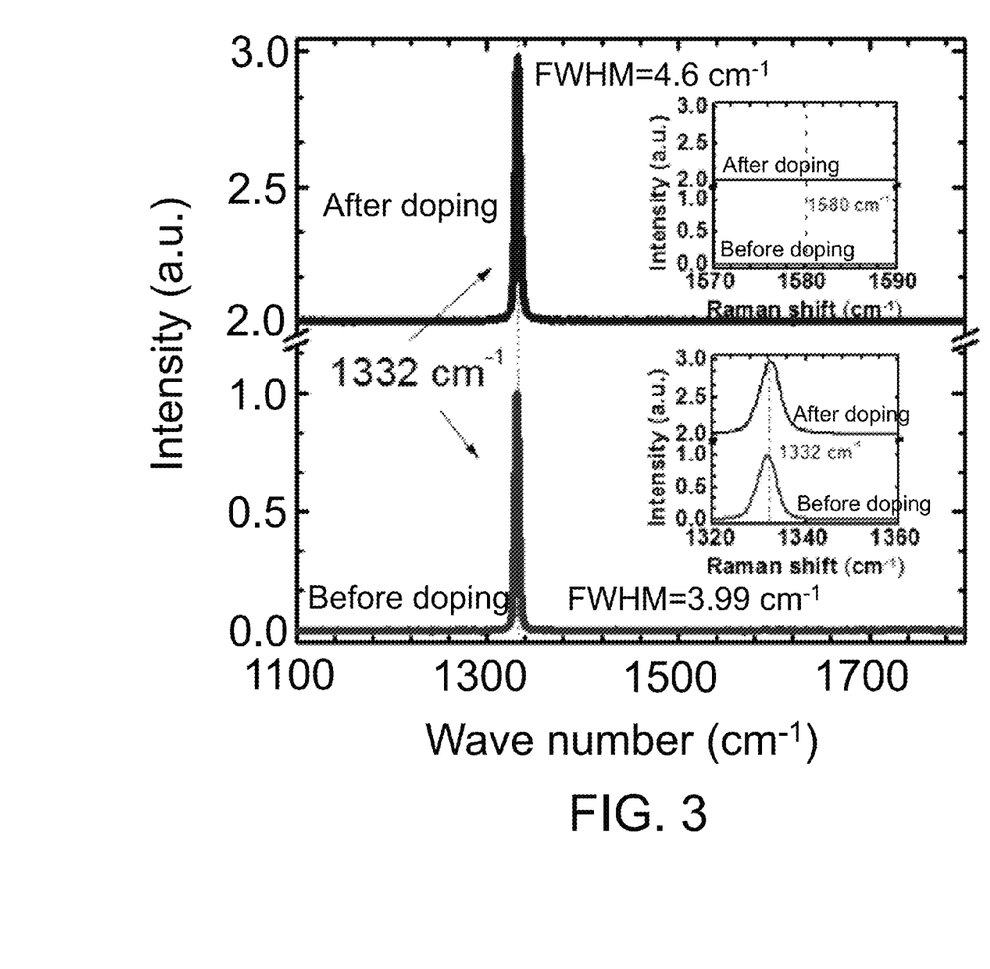
FIG. 3. Raman spectra of the single-crystalline diamond before and after boron doping scanned from 1100 to 1800 cm$^{-1}$.

After completing the SiNM removal, a Raman spectrum taken in the range from 400-1200 cm$^{-1}$ was unable to identify any remaining Si or SiC in the diamond. The X-ray theta-2theta scan results of the boron-doped diamond are shown in FIG. 2. The (220) peak of the nSCD, before and after the boron diffusion process, appeared at 75.825° in both cases. Of more importance, the full width at half maximum (FWHM) of the diamond (220) diffraction peak shows no measurable changes after finishing the diffusion process. The small FWHM value of 0.025 degrees indicates the high single crystallinity of the diamond. The Raman spectra of the nSCD before and after diffusion doping are shown in FIG. 3 for comparison. The sp$^3$ bonding in the sample before and after the thermal diffusion process is clearly indicated by the TO phonon peak at 1332 cm$^{-1}$. The FWHM of the Raman peak became slightly wider after diffusion (from 3.9 cm$^{-1}$ to 4.6 cm$^{-1}$). Such a small change could be attributed to the changing internal defect sites or dislocations that already existed in nSCD. However, the FWHM was smaller than 5 cm$^{-1}$ in both cases, further indicating that the sp$^3$ bonding in the diamond remained intact after finishing the boron diffusion process.

The x-ray diffraction (XRD) and Raman characterizations indicated that the boron doping method via SiNM bonding and thermal diffusion did not induce measurable lattice damage in the diamond. Furthermore, the absence of peaks near the wave numbers of 1357 cm$^{-1}$ and 1580 cm$^{-1}$ in the zoomed-in spectra of FIG. 3, which are characteristic indicators of the presence of sp$^2$ bonds, proved that the SiNM doping process did not induce detectable graphitization in the diamond bulk or on its surface. As comparison, a Raman spectrum was scanned from a reference nSCD sample that had no SiNM bonded but was subject to the identical RTA process. A distinct Raman peak at the wave number of 1556 cm$^{-1}$ in the spectrum clearly indicated the existence of sp$^2$ bonds that were formed on this undoped sample. To further verify the role of SiNM in preventing graphitization on the diamond surface, the Raman spectrum taken from the backside of the SiNM bonded diamond (associated with FIG. 3), where no SiNM was bonded, also shows a visible peak at the wave number of 1556 cm$^{-1}$. These results indicate that using single-crystalline SiNM as the dopant carrying medium for thermal diffusion successfully avoided graphitization on the diamond surface.

Figure 4A:
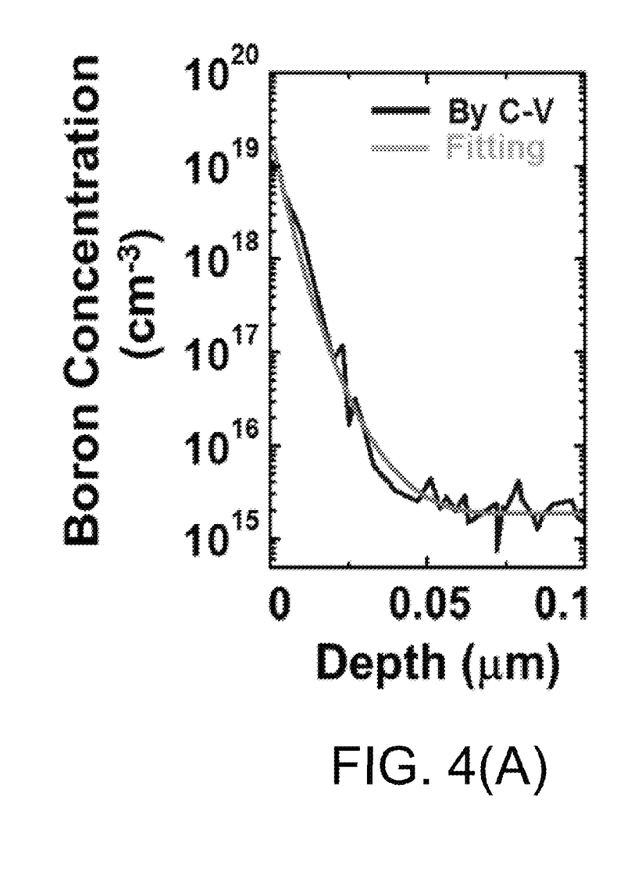
FIG. 4(A). Boron doping profile measured by the C-V method and fit (smooth curve) to Fick's law of diffusion.
Figure 4B:
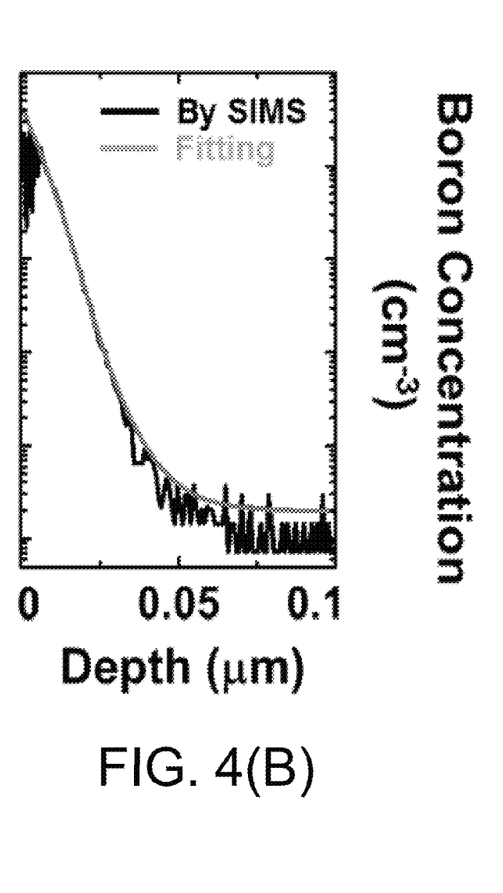
FIG. 4(B). Boron doping profile measured by the SIMS method and fit (smooth curve) to Fick's law of diffusion.

The boron depth profile was measured using the C-V and SIMS methods. The C-V and SIMS results are shown in FIGS. 4(A) and 4(B), respectively. The data were fitted using Fick's law of diffusion. Each of measured boron doping profiles measured by the SIMS and C-V methods were fitted by the equation for Fick's law of diffusion from a constant source:

$$(C(x, t) - C_{bulk}) / (C_{source} - C_{bulk}) = erfc\left(\frac{x}{(2 \cdot \sqrt{D \cdot t})}\right)$$

where, $C_{bulk}$ is the initial concentration in the bulk, ~2×10$^{-15}$ cm$^{-3}$, which is the lowest detection value in the C-V and SIMS methods and $C_{source}$ is the source concentration at x=0 and t is the time, in this case was 40 minutes (2400 seconds). For the SIMS fit, $C_{source}$ was approximately 3×10$^{19}$ cm$^{-3}$, D was approximately 1.6×10$^{-16}$ cm$^2$/s. For the CV fit, $C_{source}$ was approximately 1×10$^{19}$ cm$^{-3}$, D was approximately 1.6×10$^{-16}$ cm$^2$/s. Under these conditions, measured boron doping profiles matched well with the fitted result (smooth curves).

The SIMS profile indicated the presence of boron at a concentration of about 2.3×10$^{19}$ cm$^{-3}$ at the diamond surface, which gradually decreased to ~2.0×10$^{15}$ cm$^{-3}$ at a depth of ~70 nm, before the SIMS resolution limit of 6×10$^{14}$ cm$^{-3}$ was reached. Considering that the annealing time was only 40 minutes, the doping depth achieved is encouraging for device applications.

Capacitance-voltage (C-V) measurements were performed to measure the net hole concentration in the nSCD as follows. The depletion-layer capacitance per unit area is given by:

$$C = \frac{\varepsilon_s}{W_D} = \sqrt{\frac{q \cdot \varepsilon_s \cdot N}{2} \left(\psi_B - V - \frac{2kT}{q}\right)^{-1/2}}$$

The 1/C$^2$-V relationship is obtained by rearranging the above equation:

$$\frac{1}{C^2} = \frac{2}{q \cdot \varepsilon_s \cdot N}\left(\psi_B - V - \frac{2kT}{q}\right)$$

Then the carrier doping concentration can be extracted by taking the derivative of 1/C$^2$ with respect to voltage:

$$\frac{d(1/C^2)}{dV} = -\frac{2}{q \cdot \varepsilon_s \cdot N}.$$

Figure 11:
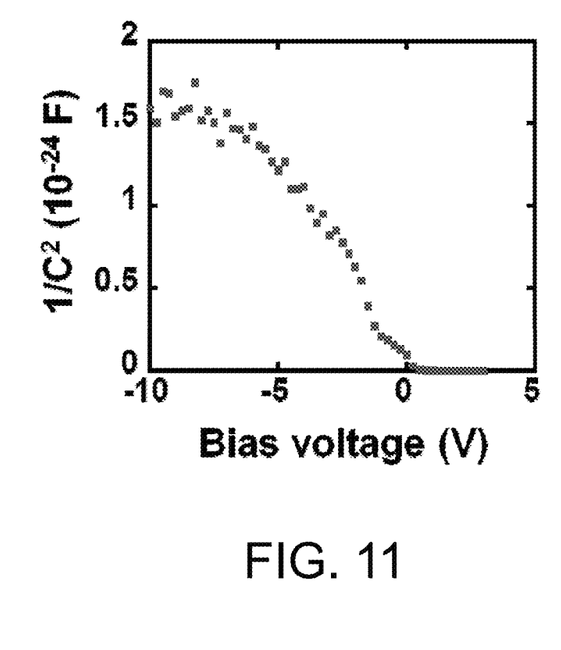
FIG. 11. The $1/C^2$ versus voltage plot measured from derivative −10 V to 5V. It was used to extract the boron doping concentration and built-in potential of a p-i junction.

FIG. 11 shows the 1/C$^2$ versus voltage plot measured from derivative -10 V to 5V.

The profile obtained by C-V measurements matched that of SIMS in terms of shape and depth.

Calculation for Boron Diffusion from SiNM into Diamond

The concentration profile from FIGS. 4(A) and 4(B) was fit to Fick's law of diffusion from a constant source and the effective diffusion coefficient of boron in diamond near the diamond SiNM interface at 800° C. was found to be 2×10$^{-16}$ cm$^2$/s. Experimental measurements of boron diffusion in diamond have found an activation barrier of approximately 4.2 eV, and an equilibrium diffusion coefficient three orders of magnitude lower at 800° C. (See, T. Sung, G. Popovici, M. A. Prelas, and R. G. Wilson, Boron Diffusion Coefficient in Diamond. Mat. Res. Soc. Symp. Proc. 416, 467 (1996).) The enhanced diffusion observed in the present study at 800° C. would correspond to an activation barrier decrease of approximately 0.7 eV, assuming the overall diffusion constant D$_0$ prefactor remains unchanged.

Further characterizations of boron-doped nSCD were performed using Fourier transform infrared spectroscopy (FTIR). Generally, boron inactivation could result from non-substitutional boron sites or aggregated substitutional boron sites. FTIR was conducted on two diamond plates of the same type: one was boron-doped using the above thermal diffusion method and the other was undoped. The boron-doped diamond showed the characteristic absorption peak at 1290 cm$^{-1}$, which clearly indicated the electrical activation of boron atoms. In contrast, the peak did not appear in the undoped reference diamond. Since substitutional doping, i.e., boron-carbon sp$^3$ bonding formation, is necessary for electrical activation of doped boron atoms, the FTIR and the C-V characterization results prove the substitutional doping of boron atoms in the nSCD. It should be noted that the characteristic absorption peaks associated with boron interstitials and boron interstitial complexes in diamond can be observed at 1420, 1530, 1570, and 1910 cm$^{-1}$, but no such peaks appeared in the FTIR spectra. Moreover, the absence of the three infrared B—B cluster absorption peaks (553, 560, and 570 cm$^{-1}$) indicate that no aggregated substitutional boron sites were formed. Broader peaks, which appeared from 1900 to 2300 cm$^{-1}$ are the inherent two-phonon lines of diamond associated with C—C bonds. They appeared in both the boron-doped and undoped diamond samples.

X-Ray photoelectron spectroscopy (XPS) was performed on the doped diamond and on an undoped reference diamond sample using a Thermo K-alpha spectrometer that was equipped with a monochromated Al Kα X-ray source. The vacuum pressure of the spectrometer during measurements was less than 2×10⁻¹⁰ Torr. The binding energies for $Si_{1s}$, $B_{1s}$ and $C_{1s}$ peaks were identified with constant pass energy of 50 eV and 100 meV energy step. A small C—Si peak at ~103 eV indicated a chemical reaction between silicon and carbon atoms at the silicon-diamond interface. However, the absence of a silicon peak in the Raman spectrum in the range of 400~1200 cm⁻¹ indicated that the silicon-carbon reaction occurred very shallowly at the diamond surface. Boron substitution in the diamond yielded $B_{1s}$ spectrum at 190.6 eV corresponding to B—C, confirming successful boron doping in agreement with the SIMS, CV and FTIR data. The XPS spectra showed the core $C_{1s}$ peak in the binding energy region around 280-295 eV for the undoped and boron-doped nSCD samples. De-convoluted $C_{1s}$ peaks using the Gaussian/Lorentzian function showed a strong $sp^3$ C—C bonding at 285.4 eV and very small C—O and C=O bonding at 286.4 eV and 287.9 eV, respectively, which indicated the single-crystallinity of nSCD was not degraded by the boron diffusion process.

Discussion.

Figure 12:
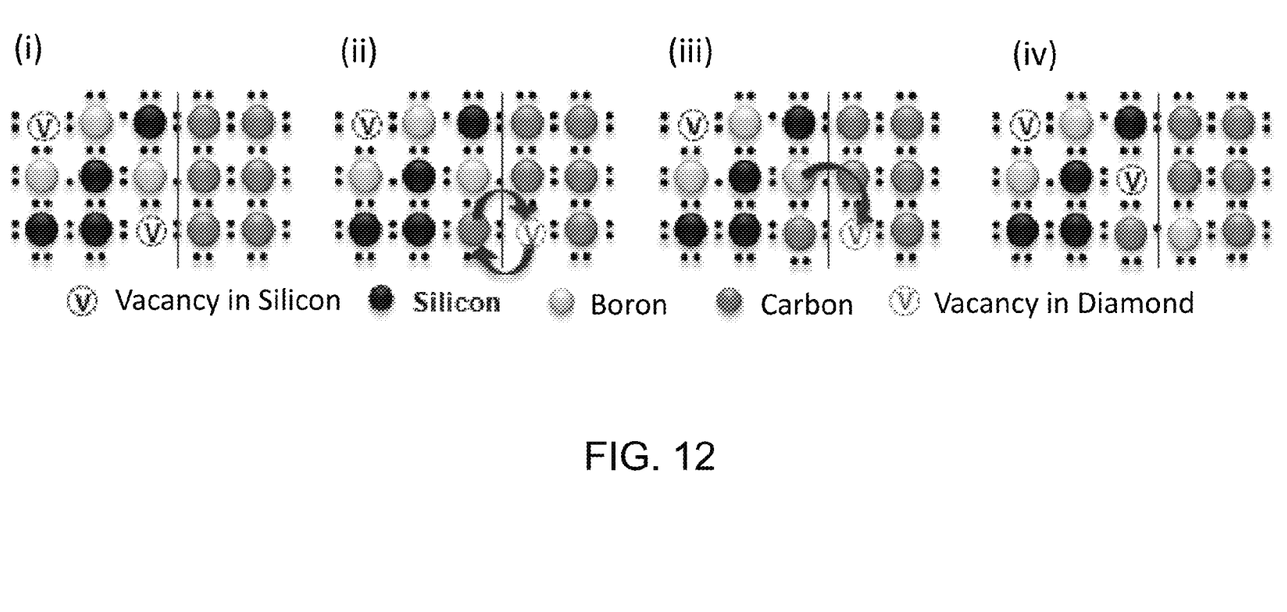
FIG. 12. A schematic illustration of a proposed injection and diffusion mechanism for the boron doping of diamond.

The XPS results suggest clues for elucidating the boron diffusion doping mechanisms. The C—Si bonding plays an important role for the observed boron diffusion. First-principles density functional theory (DFT) simulations were performed to understand the diffusion mechanism. Two mechanisms were proposed to yield enhanced vacancies in diamond. The first mechanism involved injection of excess vacancies into the diamond from the SiNM, which has a much larger intrinsic vacancy concentration than diamond as well as excess vacancies from ion implantation into the SiNM. DFT calculations verified that this vacancy injection is much more energetically favorable than the usual mechanism for vacancy formation in diamond (movement of carbon to the diamond surface). FIG. 12 shows a schematic illustration of the proposed injection and diffusion mechanism. Panel (i) shows the Si-diamond interface just after SiNM bonding to nSCD, before thermal processing. Vacancies predominately occur on the Si-side, and all boron atoms are initially present on the Si-side. As shown in panel (ii), a vacancy from the Si-side migrates across the interface, exchanging with a carbon atom from the diamond-side. This process generates a vacancy on the diamond-side at a smaller energy cost than the usual vacancy formation mechanism in diamond. Panel (iii) shows that Boron atoms from the Si-side are now able to exchange with the new vacancy on the diamond-side. Finally, as shown in panel (iv), boron is incorporated into diamond as a substitutional solute and can undergo accelerated diffusion by vacancies generated through steps (i) and (ii). Note, the schematic illustration is not meant to imply lattice matching of Si and diamond at the interface.

Excess vacancies can also be created by formation SiC, which stabilized the vacancies by almost exactly the required 0.7 eV needed to explain the enhanced boron diffusion. Both mechanisms could play a role and further research is required to elucidate their contributions.

In this study the neutral diamond vacancy formation energy was calculated to be 6.65 eV with DFT. This is within previously calculated range of 6-7 eV, although the formation energy lowers significantly for positively charged vacancies in p-type diamond. (See, J. Bernholc, A. Antonelli, T. M. Del Sole, Y. Bar-Yam, and S. T. Pantelides, Mechanism of self-diffusion in diamond. *Phys. Rev. Lett.* 61, 2689 (1988) and Randolph Q. Hood, P. R. C. Kent, R. J. Needs, and P. R. Briddon, Quantum Monte Carlo Study of the Optical and Diffusive Properties of the Vacancy Defect in Diamond. *Phys. Rev. Lett.* 91, 076403 (2003).) The vacancy migration energy for the neutral diamond vacancy has been experimentally measured to be 2.3 eV, with DFT results ranging from 1.7-2.8 eV. (See, A. van der Ziel, Solid Sate Physical Electronics/Englewood Cliffs, N.J.; Prentice-Hall (1976); J. Bernholc, A. Antonelli, T. M. Del Sole, Y. Bar-Yam, and S. T. Pantelides, Mechanism of self-diffusion in diamond. *Phys. Rev. Lett.* 61, 2689 (1988) and Randolph Q. Hood, P. R. C. Kent, R. J. Needs, and P. R. Briddon, Quantum Monte Carlo Study of the Optical and Diffusive Properties of the Vacancy Defect in Diamond. *Phys. Rev. Leu.* 91, 076403 (2003).) The DFT barrier for boron-vacancy exchange in diamond was found to be 1.47 eV, showing that the boron diffusion is limited by bulk vacancy migration.

The observed increase in boron diffusion may result from increased diamond vacancy formation at the Si-diamond interface. During annealing, interactions can occur between Si and C at the Si-diamond interface, and the energy gained from these reactions can help lower the formation energy of diamond vacancies. Two possible interactions with silicon at the interface were considered, vacancy injection and SiC formation.

Due to the much larger intrinsic vacancy concentration on the silicon side, as well as excess vacancies from ion implantation into the SiNM, it was expected that carbon atoms can jump into Si vacancies. This essentially results in an "injection" of vacancies from the SiNM into the diamond.

An estimate of the reaction energy for vacancy injection of an existing vacancy from the SiNM into the diamond can be calculated by the following equation:

$$E_{Form} = \text{Products} - \text{Reactants} = (E_{Diamond}^{Vac} + E_{Si}^{C\text{-}Sub}) - (E_{Diamond}^{Bulk} + E_{Si}^{Vac}) \quad (1)$$

where $E_{Diamond}^{Bulk}$ the energy of a bulk diamond supercell, $E_{Diamond}^{Vac}$ and $E_{Si}^{Vac}$ are the energies of a single vacancy within a diamond supercell and Si supercell, respectively, and $E_{Si}^{C\text{-}Sub}$ is the energy of a Si supercell with a single C substitution. $E_{Form}$ is the energy of the injection reaction, which is the energy needed to form a diamond vacancy and a carbon substitution in Si, starting from bulk diamond and a Si vacancy. From DFT calculations, 4.48 eV was obtained as the energy of this reaction, much less than the 6.65 eV needed to form a vacancy in pure diamond calculated with corresponding methods and approximations. Thus injection enables the formation of more diamond vacancies than are available under normal equilibrium conditions. Note that the 2.17 eV reduction in the vacancy formation energy for diamond is only available when there are excess vacancies available in the SiNM that can be accessed without any energy cost. Once these excess vacancies are gone continuing this reaction would require also contributing the energy to form a Si vacancy, at which point the reaction becomes energetically unfavorable compared to the usual diamond vacancy formation mechanism.

If the reaction at the Si-diamond interface produces SiC rather than a substitutional C in Si, then the energy gained from the reaction can be written $$E_{Form} = \text{Products} - \text{Reactants} = (E_{Diamond}^{Vac} + E_{SiC}) - (E_{Diamond}^{Bulk} + E_{Si}^{Atom}) \quad (2)$$

where $E_{SiC}$ is the energy of a pair of SiC atoms, $E_{Si}^{Atom}$ is the energy of a single Si bulk atom, and other quantities are as previously defined. The SiC heat of formation, from Si and diamond, has been determined experimentally to be −0.68 eV per formula-unit (one SiC atom pair). Thus $E_{Form}$ from reaction (2) lowers the vacancy formation energy by almost exactly the required 0.7 eV needed to explain the enhanced boron diffusion.

The graphitization-free process is thought to be directly related to the intimate bonding between Si and diamond. In the current thermal diffusion experiment, boron atoms accumulate at the bonded surface of the diamond as soon as thermal diffusion begins to occur at an elevated temperature. Therefore, no phase transition is expected to happen at the SiNM bonded diamond surface under the special thermal diffusion setting. This expectation is consistent with experimental observations.

The above boron doping method was used to fabricate diodes using a 2×2 mm², 120 μm thick nSCD plate. After completion of SiNM bonding and boron thermal diffusion from SiNM to diamond the cathode was formed on the bottom side of the diamond plate. The anode was formed directly on top of the SiNMs, which previously served as a boron carrying medium, since it is much easier to form ohmic contacts on heavily p-type doped Si. It is noted that a p-i junction was not formed between Si and diamond in this case, but between the p-type doped diamond surface and the nearly intrinsic diamond bulk. Both the anode and the cathode contacts were ohmic contacts. To prove that the p-i junction was formed in diamond not in between Si and diamond, a p-i diamond diode without an SiNM layer, which was removed after completion of boron diffusion, was fabricated.

Figure 5:
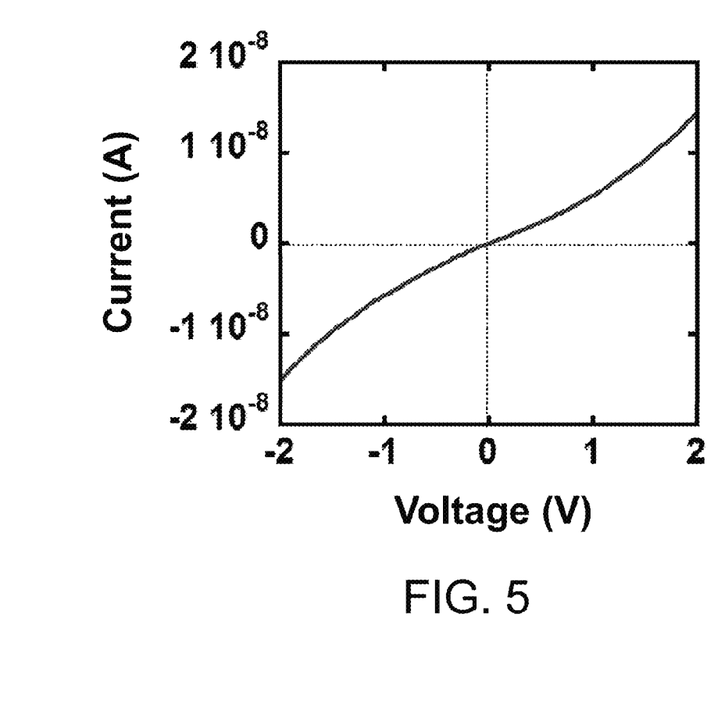
FIG. 5. Measured I-V characteristics from two adjacent bottom metal contacts of a p-i diamond diode, indicating ohmic contact behavior.
Figure 6:
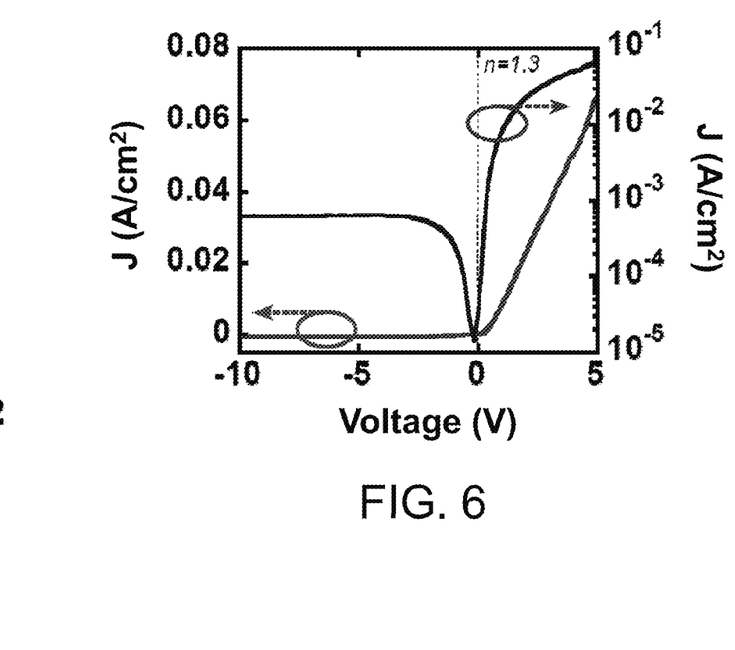
FIG. 6. Measured I-V characteristic of vertical junction diamond diode within a low bias range (−10 V~5 V).
Figure 7:
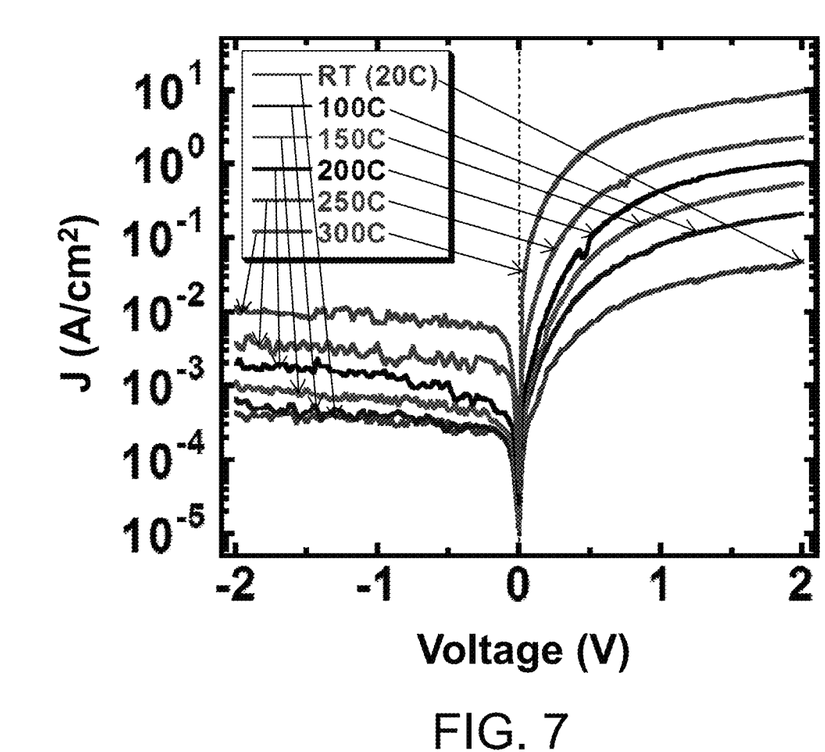
FIG. 7. Measured I-V characteristics of diamond diodes under different temperatures.
Figure 8:
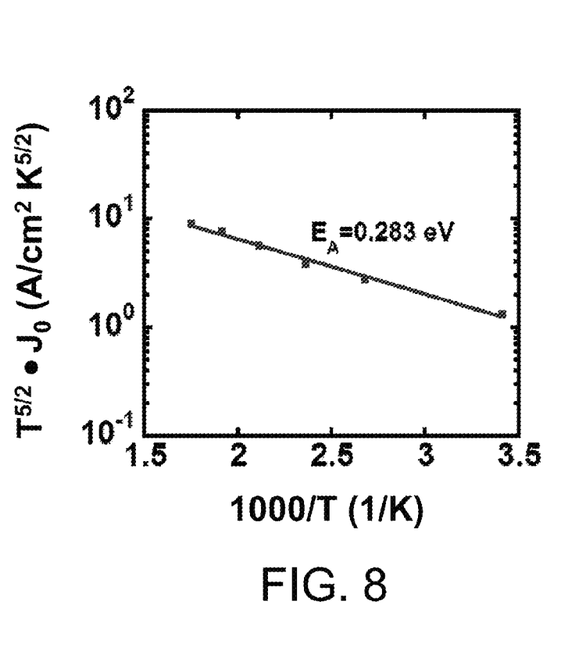
FIG. 8. Arrhenius-fit plot: $T^{5/2} \cdot J_0$ versus inverse temperature (RT to 350° C.) at zero bias for extraction of boron activation energy. The data fitting gives a boron activation energy of 0.283 eV.

FIG. 5 shows the current-voltage (I-V) characteristics from two adjacent bottom contacts formed on the diamond surface. The nearly straight I-V curve indicates that acceptable ohmic contacts are formed. FIG. 6 shows the measured forward and reverse bias (up to −10V) I-V characteristics of the p-i nSCD diode. The diode showed good rectifying behavior and the ideality factor was found to be 1.3. The current density in the vertical junction diode was 0.07 A/cm² at +5 V. The low current density was suspected to be due to the vacancy related defects that have not been annealed out at 800° C. and also possibly the low carrier density of the bulk region. FIG. 7 shows the measured diode's I-V characteristics at various temperatures (from RT to 300° C.) in order to extract the boron activation energy. As the temperature increased, both forward and reverse currents increased, with the forward current increasing faster than the reverse current, leading to an improved rectification ratio and forward ideality factor. The temperature-dependent current behavior resulted from the desirable semiconducting properties of the diamond, which further indicates the potential high temperature application of the diodes. FIG. 8 shows the Arrhenius plot of the diodes under zero bias, which is used to obtain the actual activation energy of the boron atoms. Using $J_0 \propto T^{5/2} \exp(-E_a/kT)$, where $E_a$ is the activation energy, 0.283 eV was obtained for $E_a$.

Figure 9:
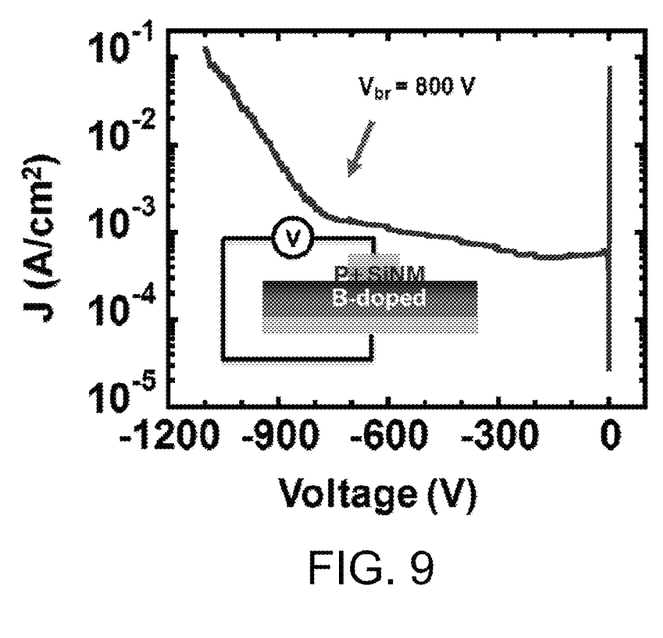
FIG. 9. Measured I-V characteristic of vertical junction diamond diodes within a high bias range. Breakdown occurs at around −800 V.

FIG. 9 shows the large reverse bias range measurement results of the diodes. The reverse bias current increases less than one order from 0 V to −800 V, where diode breakdown begins to appear. Considering the shallow boron doping depth that was achieved here, the results indicate the great potential of SCD for power rectification and switching. High quality synthetic diamond has a breakdown electric field of about $10^7$ V/cm. The breakdown electric field of natural diamond is usually about a quarter to half of the value of synthetic diamond. The diamond plate used in this study was 120 μm. A simple calculation reveals that the nearly intrinsic bulk diamond was far from being fully depleted before diode breakdown occurs. Since the boron doping depth in the diamond was very shallow and the doping concentration quickly degraded from the top surface (FIG. 4(A) and FIG. 4(B)), the boron-doped top layer was fully depleted under certain reverse bias.

Figure 10:
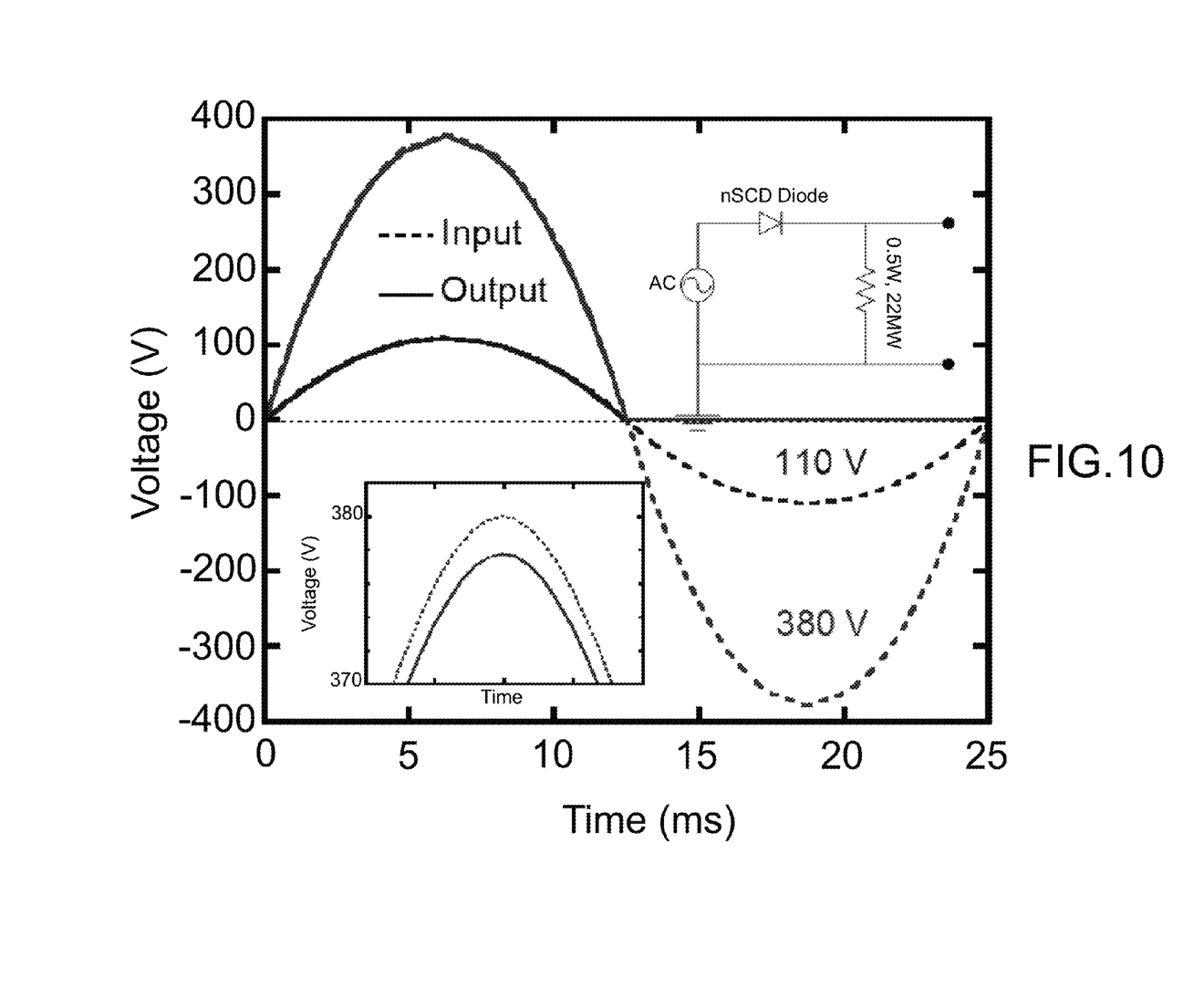
FIG. 10. Characteristics of a half-wave rectifying circuit for 60 Hz AC voltage input in one period. The bottom inset shows a zoomed-in view of a 380 V curve for 12.5 ms. The top inset shows the circuit schematic with the diamond diode connected with a 0.5 W 22 MΩ load.

A half-wave rectifier circuit was implemented using one of the fabricated p-i diodes. FIG. 10 shows the input and output waveforms of the circuit, which is shown in the inset, using AC voltages of 110 V and 380 V, respectively. Due to the excellent block voltage and low turn-on voltage of the diodes, the circuit exhibited very good rectifying characteristics. Using a 22 MΩ load resistor, the forward voltage drop was 2.2 V and 1.4 V for 380 V and 110 V ac voltages, respectively. Since the bulk region of the diamond diode was not fully depleted under reverse bias, the high series resistance (~1.1 kΩ) of the diode contributed significantly to the forward voltage drop of the rectifier.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. Boron-doped diamond comprising:
    a layer of diamond comprising a doped region extending into the layer from a surface, the doped region comprising substitutional boron dopant atoms, wherein
    the concentration of substitutional boron dopant atoms at the surface is at least $1 \times 10^{19}$ cm$^{-3}$,
    the depth profile of the substitutional boron dopant atoms corresponds to a complimentary-error-function, and
    the doped region comprises silicon dopant atoms at a depth of less than 5 nm from the surface.

2. The diamond of claim 1, wherein the concentration of substitutional boron dopant atoms at the surface is at least $2 \times 10^{19}$ cm$^{-3}$.

3. The diamond of claim 1, wherein the concentration of substitutional boron dopant atoms at the surface is at least $2.2 \times 10^{19}$ cm$^{-3}$.

4. The diamond of claim 1, wherein the concentration of substitutional boron dopant atoms at a depth of 100 nm from the surface is no greater than $1 \times 10^{16}$ cm$^{-3}$.

5. The diamond of claim 1, wherein the concentration of substitutional boron dopant atoms at a depth of 100 nm from the surface is no greater than $1 \times 10^{15}$ cm$^{-3}$.

6. The diamond of claim 1, wherein the boron doped diamond is extrinsically doped with the substitutional boron dopant atoms to a depth of at least 100 nm.

7. The diamond of claim 1, wherein the surface is free of graphitized diamond.

8. The diamond of claim 1, wherein the diamond is natural diamond.

9. The diamond of claim 1, wherein the diamond comprises type IIa diamond.

10. The diamond of claim 1, wherein the diamond is single-crystalline diamond.

11. The diamond of claim 1, wherein the diamond is single-crystalline diamond, the concentration of substitutional boron dopant atoms at the surface is at least $2\times10^{19}$ cm$^{-3}$, and the concentration of substitutional boron dopant atoms at a depth of 100 nm from the surface is no greater than $1\times10^{16}$ cm$^{-3}$.

12. The diamond of claim 1, wherein the boron doped diamond is free of silicon dopant atoms at a depth of 5 nm or greater from the surface.

13. A method of making the substitutionally boron-doped diamond, the method comprising:
bonding a boron-doped single-crystalline silicon nanomembrane to the surface of a layer of diamond; and
annealing the diamond and the nanomembrane at a temperature of at least 700° C. for a time sufficient to allow boron dopant atoms from the nanomembrane to diffuse into the layer of diamond to form a doped region in the diamond, the doped region comprising substitutional boron dopant atoms,
wherein the concentration of substitutional boron dopant atoms at the surface is at least $1\times10^{19}$ cm$^{-3}$ and the depth profile of the substitutional boron dopant atoms corresponds to a complimentary-error-function, and
further wherein silicon atoms from the nanomembrane also diffuse into the layer of diamond, such that the doped region comprises silicon dopant atoms at a depth of less than 5 nm from the surface.

14. The method of claim 13, wherein the concentration of boron dopant atoms at the surface of the layer of diamond is at least $2\times10^{19}$ cm$^{-3}$.

15. The method of claim 13, wherein the annealing temperature is no greater than about 1000° C.

16. The method of claim 13, wherein the boron dopant atom concentration in the boron-doped single-crystalline silicon nanomembrane is at least $1\times10^{19}$ cm$^{-3}$ at the surface of the membrane that is bonded to the surface of the layer of diamond.

17. The method of claim 13, wherein the boron dopant atom concentration in the boron-doped single-crystalline silicon nanomembrane is at least $1\times10^{-3}$ at the surface of the membrane that is bonded to the surface of the layer of diamond.

18. The method of claim 13, wherein the boron-doped single-crystalline silicon nanomembrane has a thickness of no greater than about 100 nm.

19. The method of claim 13, wherein the boron-doped single-crystalline silicon nanomembrane has a thickness of no greater than about 500 nm.

20. The method of claim 13, wherein the diamond is single-crystalline diamond.

* * * * *

UNITED STATES PATENT AND TRADEMARK OFFICE
CERTIFICATE OF CORRECTION

PATENT NO. : 9,605,359 B2
APPLICATION NO. : 14/508187
DATED : March 28, 2017
INVENTOR(S) : Zhenqiang Ma et al.

Page 1 of 1

It is certified that error appears in the above-identified patent and that said Letters Patent is hereby corrected as shown below:

In the Claims

Claim 17, Column 14, Line 15:
Delete "at least $1\times10^{-3}$" and replace with --at least $1 \times 10^{20}$ cm$^{-3}$--

Claim 18, Column 14, Line 19:
Delete "about 100 nm" and replace with --about 1000 nm--

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*